(12) United States Patent
Knights et al.

(10) Patent No.: US 8,326,094 B2
(45) Date of Patent: Dec. 4, 2012

(54) IN-LINE LIGHT SENSOR

(75) Inventors: Andrew Peter Knights, Grimsby (CA);
Adrian Petru Vonsovici, London (GB);
Dominic Joseph Brady, Headington
(GB); Andrew Alan House, Headington
(GB); George Frederick Hopper,
Maidenhead (GB)

(73) Assignee: Kotura, Inc., Monterey Park, CA (US)

( * ) Notice: Subject to any disclaimer, the term of this patent is extended or adjusted under 35 U.S.C. 154(b) by 5 days.

(21) Appl. No.: 12/807,973

(22) Filed: Sep. 17, 2010
(Under 37 CFR 1.47)

(65) Prior Publication Data

US 2011/0013864 A1 Jan. 20, 2011

Related U.S. Application Data

(63) Continuation of application No. 12/080,824, filed on Apr. 4, 2008, now Pat. No. 7,826,700, which is a continuation of application No. 10/500,318, filed as application No. PCT/GB02/05930 on Dec. 27, 2002, now Pat. No. 7,386,207.

(30) Foreign Application Priority Data

Dec. 27, 2001 (GB) .................................. 0131001.0
Dec. 27, 2001 (GB) .................................. 0131003.6
Aug. 14, 2002 (GB) .................................. 0218842.3

(51) Int. Cl.
*G02F 6/12* (2006.01)
*G02F 6/26* (2006.01)
*G02F 6/00* (2006.01)

(52) U.S. Cl. ................................ 385/12; 385/14; 385/40
(58) Field of Classification Search .................... 385/12, 385/40, 14
See application file for complete search history.

(56) References Cited

U.S. PATENT DOCUMENTS

| | | | | |
|---|---|---|---|---|
| 3,952,265 | A * | 4/1976 | Hunsperger | 372/50.21 |
| 4,226,898 | A * | 10/1980 | Ovshinsky et al. | 438/483 |
| 4,766,471 | A * | 8/1988 | Ovshinsky et al. | 257/53 |
| 4,773,074 | A * | 9/1988 | Hunsperger et al. | 372/50.21 |
| 5,051,804 | A * | 9/1991 | Morse et al. | 257/463 |
| 6,403,975 | B1 * | 6/2002 | Brunner et al. | 257/15 |
| 6,670,599 | B2 * | 12/2003 | Wagner et al. | 250/214.1 |
| 6,831,309 | B2 * | 12/2004 | Giboney | 257/184 |
| 7,067,072 | B2 * | 6/2006 | Chen | 252/301.6 S |
| 7,072,557 | B2 * | 7/2006 | Nagarajan et al. | 385/131 |
| 2003/0165314 | A1 * | 9/2003 | Nagarajan et al. | 385/131 |
| 2004/0119129 | A1 * | 6/2004 | Giboney | 257/458 |
| 2010/0307555 | A1 * | 12/2010 | Forrest et al. | 136/244 |

* cited by examiner

*Primary Examiner* — K. Cyrus Kianni
(74) *Attorney, Agent, or Firm* — Gavrilovich, Dodd & Lindsey, LLP

(57) ABSTRACT

The sensor includes an optical waveguide defined in a light-transmitting medium. The waveguide includes a sensing portion and an non-sensing portion. The light-transmitting medium included in the sensing portion has defects that provide the light-transmitting medium with a deep band gap level between a valence band of the light-transmitting medium and a conduction band of the light-transmitting medium. The deep band gap level is configured such that the waveguide guiding light signals through the light-transmitting medium in the sensing portion causes free carriers to be generated in the light-transmitting medium. A detector is configured to detect the free carriers in the sensing region of the waveguide.

20 Claims, 11 Drawing Sheets

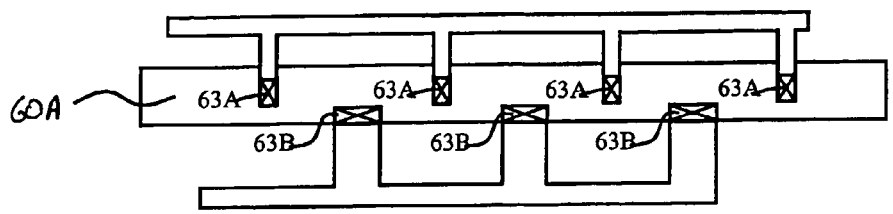
Figure 10
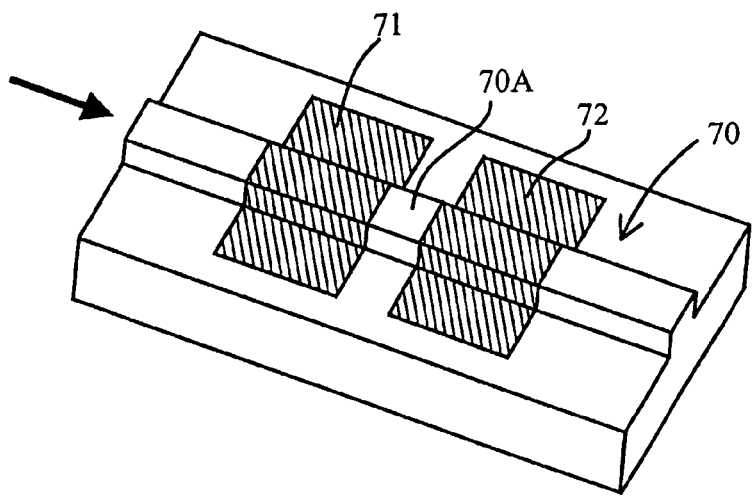
Figure 11
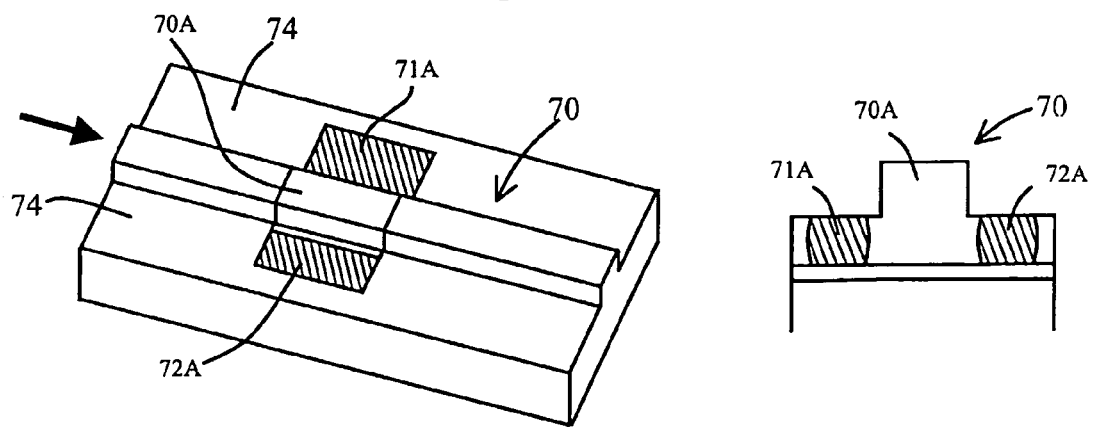
Figure 12A
Figure 12B

_US 8,326,094 B2_

IN-LINE LIGHT SENSOR

RELATED APPLICATIONS

This application is a continuation of U.S. patent application Ser. No. 12/080,824; filed on Apr. 4, 2008 now U.S. Pat. No. 7,826,700 and entitled "In-Line Light Sensor;" which is a continuation of U.S. patent application Ser. No. 10/500,318; filed on May 9, 2005 now U.S. Pat. No. 7,386,207 and entitled "In-Line Light Sensor;" which is a National Phase Application of PCT/GB02/05930, filed on Dec. 27, 2002, entitled "In-Line Light Sensor;" which claims the benefit of priority of GB patent application GB0131001.0 filed on Dec. 27, 2001; and PCT/GB02/05930 also claims the benefit of priority of GB patent application GB0131003.6 filed on Dec. 27, 2001; and PCT/GB02/05930 also claims the benefit of priority of GB patent application GB0218842.3 filed on Aug. 14, 2002; each of which is incorporated herein in its entirety.

TECHNICAL FIELD

This invention relates to an in-line light sensor, in particular a light sensor for sensing an optical signal transmitted along an integrated optical waveguide.

BACKGROUND ART

A variety of types of light sensors are known which can be mounted on an integrated optical circuit in order to receive light from a waveguide integrated on the circuit. One example is a SiGe/Si multi-quantum well (MQW) structure arranged to form a photodetector which can be mounted on a silicon optical circuit to receive an optical signal directed thereto by a waveguide.

The present invention aims to provide a light sensor having advantages over such known light sensors.

SUMMARY OF INVENTION

According to a first aspect of the invention, there is provided an integrated optical waveguide having an in-line light sensor integrally formed therewith, comprising: a first part of the waveguide leading to a photodiode portion thereof; a second part of the waveguide leading away from the photodiode portion, the photodiode portion comprising one or more regions of light absorbing material within the waveguide arranged to absorb a minor proportion of light of one or more selected wavelengths transmitted along the waveguide and thereby to generate free charge carriers within the waveguide; and detecting means for detecting the presence of said free charge carriers.

According to a second aspect of the invention, there is provided a method of fabricating such a waveguide in which the photodiode portion and the detecting means are fabricated by one or more of the following: photolithographic techniques, doping and ion implantation.

According to another aspect of the invention, there is provided an integrated optical waveguide having an in-line light sensor integrally formed therewith the light sensor comprising a p-i-n diode formed in a semiconductor substrate having an energy band gap the magnitude of which corresponds to absorption of photons of a first wavelength, the photodiode comprising a substantially intrinsic region in said semiconductor substrate between p- and n-doped regions, the intrinsic region being modified to introduce deep band gap levels therein so as to provided at least partial absorption of photons of an optical signal of a selected wavelength or wavelength band greater than said first wavelength and thus generate an electrical signal across the p-i-n diode indicative of said optical signal, said photodiode being provided within a resonant cavity.

Preferred and optional features of the invention will be apparent from the following description and from the subsidiary claims of the specification.

BRIEF DESCRIPTION OF DRAWINGS

The invention will now be further described, merely by way of example, with reference to the accompanying drawings, in which:

FIG. 10 is a plan view of another embodiment of an in-line light sensor according to the invention;

FIG. 11 is a perspective view of a further embodiment of an in-line light sensor according to the invention;

FIG. 12A is a perspective view of yet a further embodiment of an in-line light sensor according to the invention and FIG. 12B is a cross-sectional view thereof;

BEST MODE OF THE INVENTION

Figure 1:
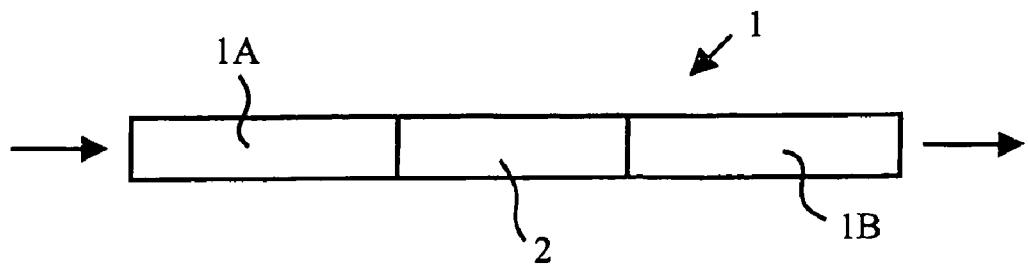
FIG. 1 is a schematic plan view of a waveguide with an in-line light sensor according to a preferred version of the invention.

FIG. 1 shows a waveguide 1 which forms part of an integrated optical circuit (not shown) formed on a planar substrate, e.g. a silicon chip. A first part 1A of the waveguide receives an input signal and transmits this to a portion of the waveguide which is arranged to provide an in-line light sensor in the form of a photodiode 2 and a second part 1B of the waveguide receives the signal leaving the photodiode 2 and directs this to an output.

The in-line photodiode 2 is arranged to be partially transparent so that it absorbs only a minor proportion of the light transmitted along the waveguide 1 in a single pass therethrough. The photodiode 2 comprises one or more light absorptive regions which absorb part of the signal being transmitted along the waveguide. In a typical arrangement, the absorptive regions may, for instance, absorb 5% or less of the signal being transmitted along the waveguide (in a single pass therethrough).

The degree of absorption of the signal may be controlled by the dimensions of the absorptive region, e.g. by its length along the waveguide and depth (perpendicular to the plane of the chip), and/or by controlling the absorption coefficient thereof.

In a typical arrangement, the absorptive region may, for example, have a length in the range 100-10,000 microns and a depth of around 0.1 microns. If the optical interaction between the light signal and the absorptive region is relatively small, a relatively long interaction length (i.e. a long photodiode region) can be used to ensure a photocurrent of the desired magnitude is produced.

The absorptive region is arranged to generate free charge carriers when light of one or more selected wavelengths is incident thereon and these are detected by a diode formed across or within the waveguide as will be described further below.

The photodiode absorptive region(s) may comprise any material which generates free charge carriers when light of one or more selected wavelengths is incident thereon. The photodiode region may, for instance, comprise a semiconductor material having a band gap of a size such that photons of a given wavelength (or shorter wavelengths) are able to excite charge carriers across the band gap from the valence band to the conduction band. Alternatively, it may comprise a semiconductor material whose band gap is too large for this to occur for the wavelength(s) of interest but in which deep band gap levels are formed between the conduction and valence bands to facilitate the generation of free charge carriers upon illumination by such wavelengths. It may also comprise light absorptive material such as polycrystalline or amorphous semiconductor materials.

The term "deep band gap levels" as used herein refers to states between the valence band and conduction band of the semiconductor material but spaced therefrom by a sufficient energy gap such that thermal excitation of electrons from the valence band to the deep band gap state or from the deep band gap state to the conductive band is small. It will be appreciated that the magnitude of this energy gap will depend upon the temperature of the device, and, whilst the present invention is not limited to temperature, it is primarily directed towards device designed to operate in the temperature range of 0 to 100 degrees Centigrade.

Figure 2:
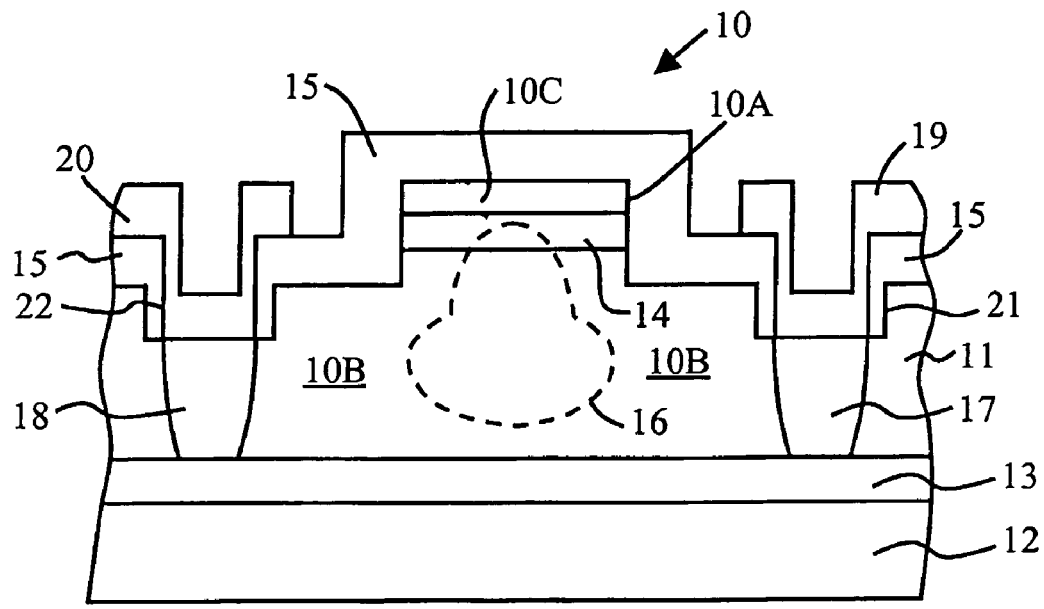
FIG. 2 is a schematic cross-sectional view through a first embodiment of such an in-line light sensor.
Figure 3:
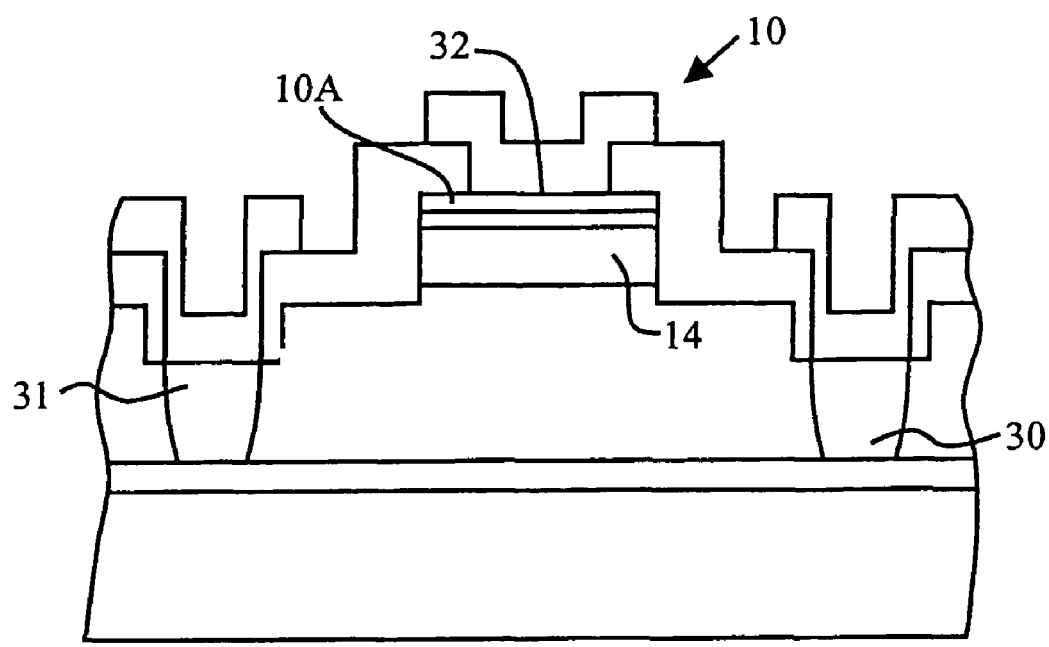
FIG. 3 is a cross-sectional view through a second embodiment of such an in-line light sensor.

FIGS. 2 and 3 shows cross-sections through in-line photodiodes formed within rib waveguides 10 fabricated in an optically conductive silicon layer 11. Preferably, the silicon layer 11 is separated from a supporting substrate 12 (typically also of silicon), by an optical confinement layer 13 (typically of silicon dioxide). Such a structure is conveniently formed from a silicon-on-insulator chip (as widely used for integrated electrical circuits).

FIG. 2 shows an absorptive region 14 formed within a rib 10A of the rib waveguide 10, the rib projecting from a slab region 10B of the silicon layer 11.

In this example, the absorptive region 14 is spaced from the upper surface of the rib 10A leaving a silicon buffer region 10C therebetween to provide the desired overlap between the absorptive region 14 and the optical mode transmitted along the waveguide (the approximate location of the mode profile of a signal guided by the rib waveguide is shown by dashed lines 16). An oxide layer 15 is provided over the silicon layer 11 for optical confinement and electrical insulation.

When an optical signal is transmitted along the waveguide, part of the signal will be absorbed by the absorptive region 14. This generates free charge carriers within the waveguide and these are detected by a lateral p-i-n diode formed across the waveguide. The p-i-n diode comprises a p-doped region 17 and an n-doped region 18 formed in the silicon layer 11 on opposite sides of the rib waveguide with a nominally intrinsic region therebetween. Metal contacts 19 and 20 are provided to provide electrical connection to the p- and n-doped regions 17 and 18, respectively.

P-i-n diodes are known for injecting charge carriers into a waveguide to alter its refractive index and to attenuate optical signals therein but in this case the p-i-n diode is used to collect charge carriers generated by the partial absorption of an optical signal by absorptive region 14 and thus provide an electrical signal indicative of the optical signal within the waveguide.

In the embodiment shown, the p and n-doped regions 17 and 18 are formed beneath recesses 21 and 22 formed in the silicon layer 11. This helps ensure the p- and n-doped regions extend through the silicon layer 11 to the oxide layer 13 and allows a smaller structure to be formed without increasing optical losses caused by the presence of the doped regions adjacent the waveguide. The collection efficiency of the photogenerated charge carriers is also improved (as is the speed of the device) by reducing the distance between the absorptive region 14 and the doped regions 17 and 18.

The dimensions of a waveguide are typically in the range 1-10 microns so the distance the charge carriers have to move to be collected by the p- or n-doped regions 17 and 18 from the locations where they are generated (in the absorptive region 14) is typically 10 microns or less in such arrangement and preferably 5 microns or less. This not only increases the speed of the device, i.e. the time between the optical signal being received by the absorptive region and the generation of an electrical signal across the p-i-n diode is very short, but also reduces the opportunity for impurities or other materials in the silicon layer from absorbing the charge carriers (and thus preventing them from reaching the p- or n-doped regions 17 and 18).

As the light sensor is intended to monitor the signal being transmitted along the waveguide, the absorptive region 14 is preferably located in a position where it only partially overlaps the optical mode 16. In the illustrated example, the absorptive region 14 is located within the rib 10A towards the uppermost portion thereof. Alternatively, or additionally, one or more absorptive regions could be provided in the slab region 10B on one or both sides of the rib waveguide, i.e. between the rib 10A and the doped region 17, 18, or at the bottom of the silicon layer 11 adjacent the oxide layer 13.

Figure 4:
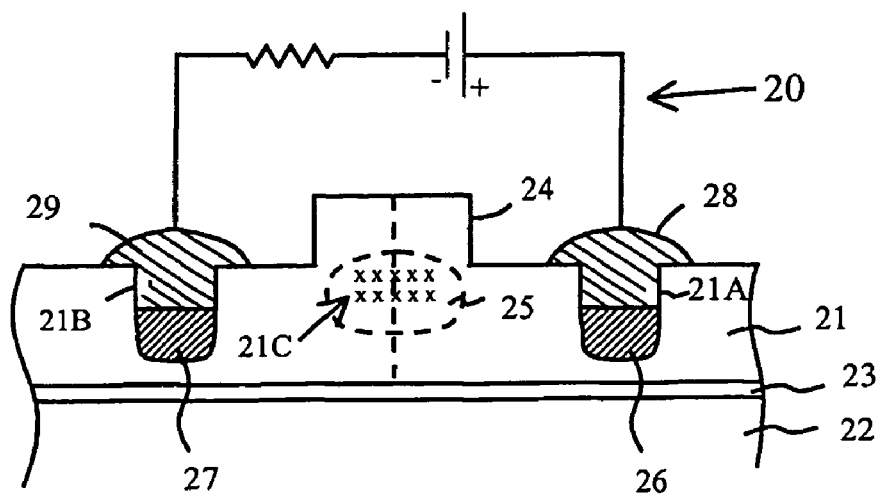
FIG. 4 is a schematic, cross sectional view of an in-line light sensor according to a third embodiment of the invention.

In other arrangements, depending upon the nature of the absorptive region and the degree of absorption required, the absorptive region may be positioned so as to maximise the overlap with the optical mode, e.g. as shown in FIG. 4 (described further below).

FIG. 3 shows an alternative arrangement which is similar to that of FIG. 2 except that the p-i-n diode is formed between p-doped regions 30, 31 on one or both sides of the rib waveguide 10 and an n-doped region 32 provided in the upper surface of the rib 10A (or vice versa). Such a vertical arrangement may be more appropriate with thicker waveguides (measured perpendicular to the plane of the chip).

In many applications, it is desirable to sense optical signals of a selected wavelength or wavelength band. Discrete silicon based p-i-n photodiodes are used in the opto-electronics industry. However, their efficiency is greatest in the wavelength region 0.6-0.8 microns (which corresponds to energies above the band-gap of silicon).

Silicon based optical circuits are now being produced and these require photodiodes for sensing optical signals within the circuits. To date, such photodiodes have been formed of other materials, e.g. InGaAs/Ge, which are capable of sensing the wavelengths of 1.3 and 1.5 microns commonly used in opto-communication devices and/or are of such a construction that the diode has to be hybridised with the silicon circuit, i.e. mounted thereon as a separate component.

FIG. 4 shows a schematic, cross-sectional view of a p-i-n photodiode formed in a silicon substrate somewhat similar to that of FIG. 2 where the silicon substrate comprises a silicon-on-insulator chip having a silicon light conducting layer 21 separated from a substrate 22, which is also typically of silicon, by a light confining layer 23, e.g. of silicon dioxide.

A rib 24 is formed in the silicon layer 21 so as to form a rib waveguide therein. The approximate position of the optical mode within this waveguide is illustrated by the dashed line 25.

Recesses 21A and 21B are preferably formed in the silicon layer 21 and n- and p-doped regions 26 and 27 formed in the silicon layer 21 by doping through these recesses. Electrical contacts 28 and 29 connect the n- and p-doped regions to an electrical circuit 20 arranged to provide a reverse bias between the n- and p-doped regions. In some cases, a reverse bias may not be applied and the electrical circuit just used to detect the photocurrent generated.

Other doping arrangements for the p-i-n diode are possible, e.g. without the recesses 21A and 21B or side-doped arrangements as described in WO 00/10039.

The layer 21 of silicon between the n- and p-doped regions is substantially intrinsic so this arrangement forms a p-i-n diode across the rib waveguide. However, the intrinsic region is modified to introduce deep band gap levels therein as indicated by the Xs in region 21C of FIG. 4. These levels can be excited by sub-band-gap photons so producing free charge carriers and thus a measurable electrical signal in the circuit 20 upon application of a voltage across the p-i-n diode.

Deep band gap levels are preferably introduced by ion implantation which can give rise to free charge carriers in several ways:

(i) ion implantation induced defects (in the crystalline structure) in the intrinsic material. In this case, charge carriers may be excited into the deep-gap states upon illumination by light of the appropriate wavelength and then undergo "hopping" conduction from defect to defect.

(ii) ion implantation induced defects in doped material, the defects resulting from the implantation of non-dopant atoms such as silicon, helium or hydrogen. Charge carriers will be trapped in the deep-gap defect states and released to the conduction band upon illumination by light of the appropriate wavelength.

(iii) ion implantation and subsequent activation by heat treatment of deep-level impurities, e.g. gold, oxygen or carbon atoms. The heat treatment typically involves heating to 650-1000 degrees C. for several seconds. The impurity atoms occupy sites in the crystal lattice and the electrons associated therewith form the deep band gap states. The heat treatment re-crystallises the silicon to repair the damage caused by the implantation of the impurities. These impurities thus form substitutional dopants which distort the crystal lattice.

The formation of deep band gap levels and the mechanisms by which they give rise to free charge carriers are known so will not be described in greater detail.

Impurities which are used as substitutional dopants should preferably have the following properties:
 a) they should give rise to deep levels within the band gap at the required energy level(s).
 b) have relatively low diffusion rates (to provide control over their location and provide stability, i.e. lack of drift in properties during use).
 c) be reasonably soluble so a sufficient concentration can be implanted.
 d) have a sufficiently strong optical interaction so as to provide a detectable photocurrent.

The use of ion implantation to form the deep band gap levels allows precise control of their depth and concentration so the amount of light absorbed can be tightly controlled. In the example shown in FIG. 2, the deep band gap levels are formed at a depth which corresponds with the location of the optical mode 5 so as to maximise the interaction therewith. However, as mentioned above, in other arrangements the deep band gap levels may be located so as to interact with only part of the optical mode.

Figure 5:
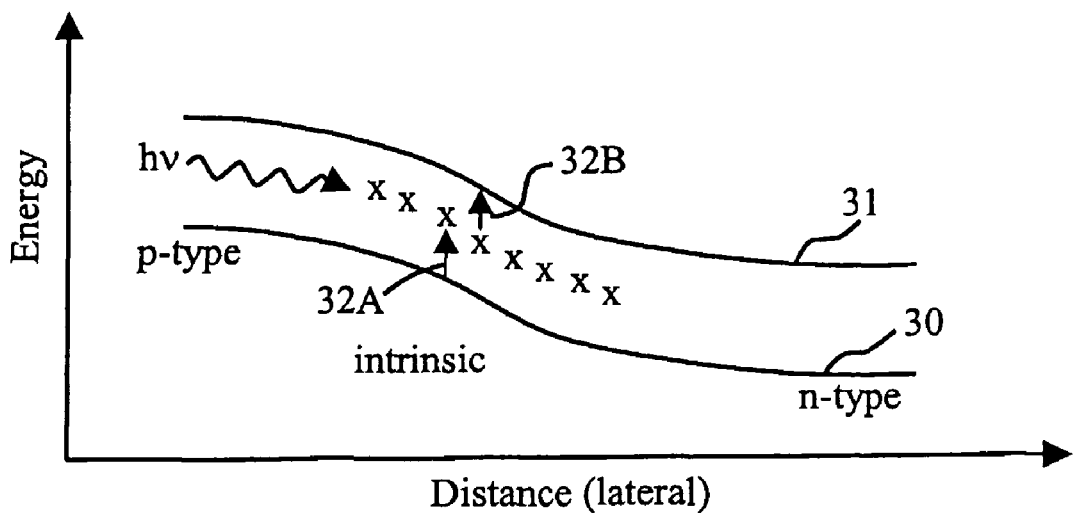
FIG. 5 is a band-gap diagram illustrating the operation of a light sensor such as that shown in FIG. 4.

FIG. 5 is a band-gap diagram illustrating operation of the device. The lines 30 and 31 represent the energy levels of the band gap from the p-doped region to the n-doped region when the p-i-n diode is under reverse bias. The Xs again represent the deep band gap levels and are located in the intrinsic region between the band-gap energy levels. Charge carriers absorbing incoming photons (indicated by hυ) can be excited from the lower energy level 30 to the deep-sub-band-gap levels as indicated by vertical arrow 32A and then take part in hopping conduction. Alternatively, carriers absorbing incoming photons can be excited from the deep-sub-band-gap levels to the upper energy level 31 as indicated by vertical arrow 32B.

A p-i-n photodiode such as that described above can be integrated with an optical circuit formed on the silicon-on-insulator chip using conventional fabrication techniques, e.g. photolithography, doping and/or ion implantation, used in the fabrication of other features of the integrated optical device. The need to hybridise a photodiode onto the silicon chip is thus avoided.

FIGS. 6A-6F illustrate a method by which a photodiode such as that described above may be fabricated.

Figure 6A:
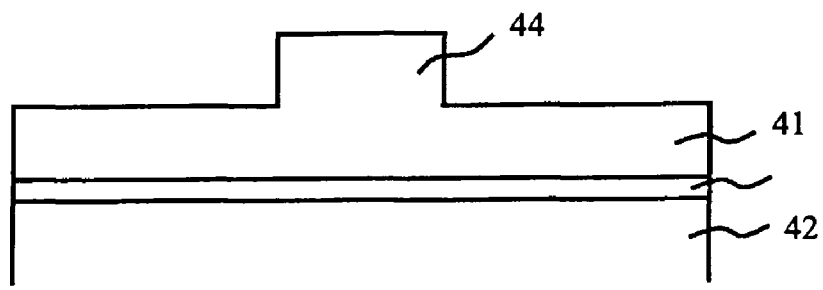
FIG. 6A to 6F illustrates steps in a preferred method of fabricating a light sensor such as that shown in FIG. 4.

FIG. 6A illustrates a rib 44 etched in the silicon layer 41 of a silicon-on-insulator chip.

Figure 6B:
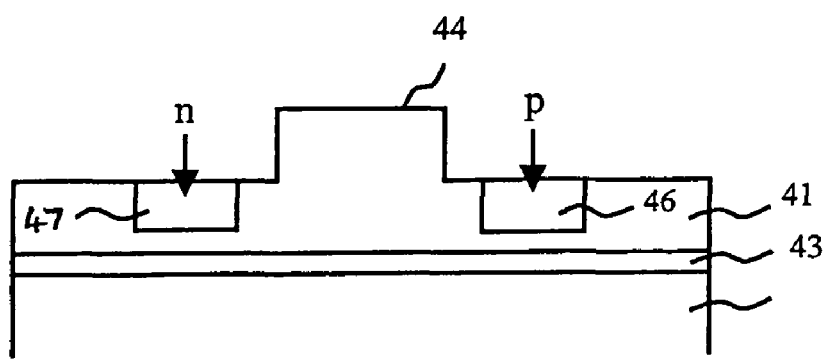

FIG. 6B shows the formation of p- and n-doped regions 46 and 47 by conventional doping techniques.

Figure 6C:
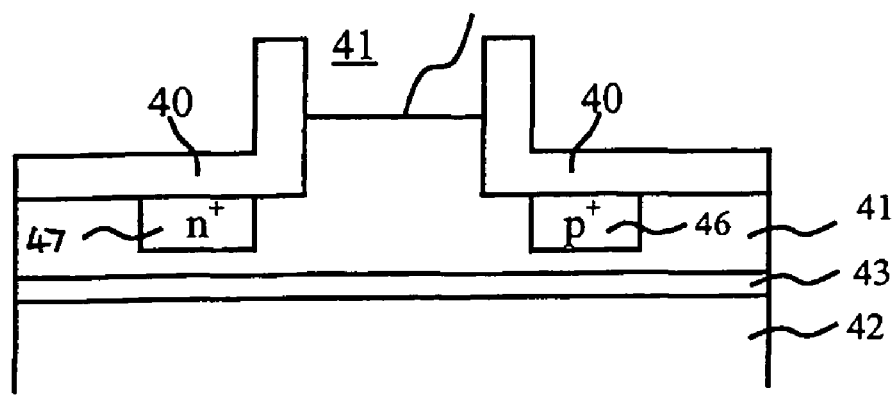

A mask 40, e.g. of silicon dioxide is then formed over the device and a window 41 formed in the mask to expose the upper surface of rib 44 as shown in FIG. 6C.

Figure 6D:
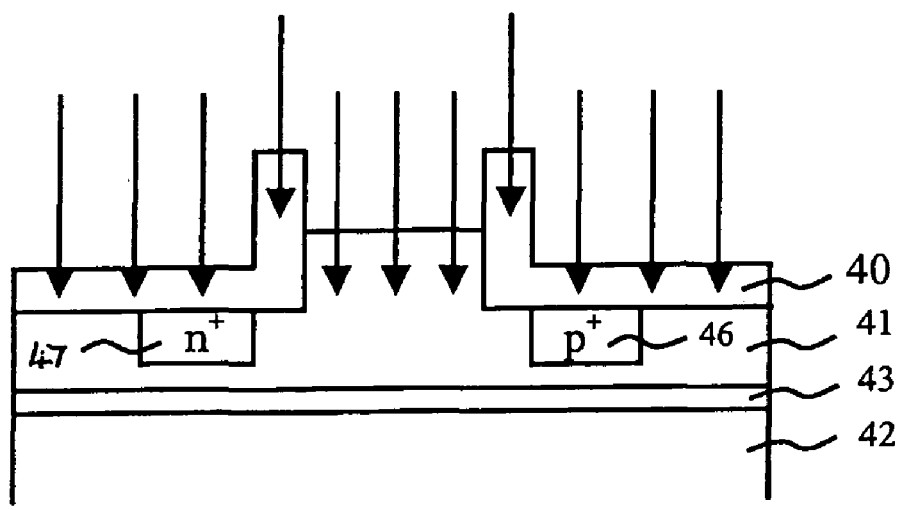
Figure 6E:
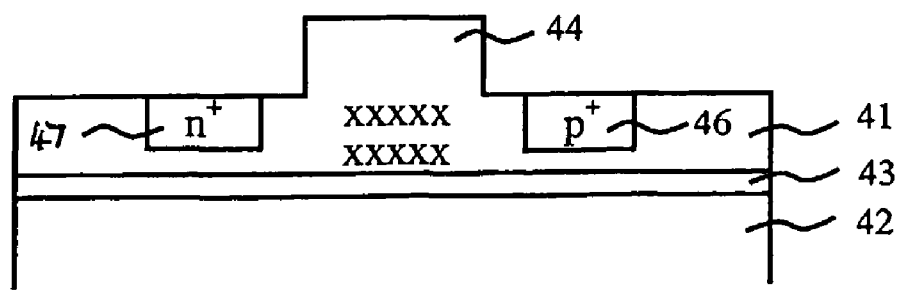

FIG. 6D illustrates the ion implantation step through the window 41 in the mask 40. Ions such as $Si^+$, $He^+$ or $H^+$ may be implanted to create damage in the crystalline silicon layer 41, e.g. vacancy pairs and higher order vacancy clusters. Such damage in turn creates deep-sub-band-gap states allowing subsequent detection of deep-sub-band-gap light as described by mechanisms (i) and (ii) above. $H^+$ implantation, i.e. proton implantation, is preferred in some cases because it allows defects to be formed at any desired depth within the waveguide. Alternatively, ions such as $Au^+$, $O^+$ or $C^+$ may be implanted. These ions, once electrically activated, create deep-sub-band-gap states allowing subsequent detection of deep-sub-band-gap light as described in mechanism (iii) above.

The mask 40 is then removed and the device thermally treated to either engineer the defect structure (in the case of, e.g., Si$^+$, He$^+$ or H$^+$ implantation) or electrically activate the deep electrical dopants (in the case of, e.g., Au$^+$, C$^+$ or O$^+$ implantation). In the case of defect engineering, this typically involves heat treatment at relatively low temperatures, e.g. between 25 and 800 degrees C. for several seconds. In the case of electrical activation (i.e. activation of the p- or n-dopant), this will typically involve heat treatment at temperatures between 650 and 1000 degrees C. for several minutes. The heat treatment also stabilises the device by removing defects which may otherwise slowly dissipate over time (leading to drift in device performance). The deep-sub-band gap defects thus produced are indicated by Xs in FIG. 6E.

Figure 6F:
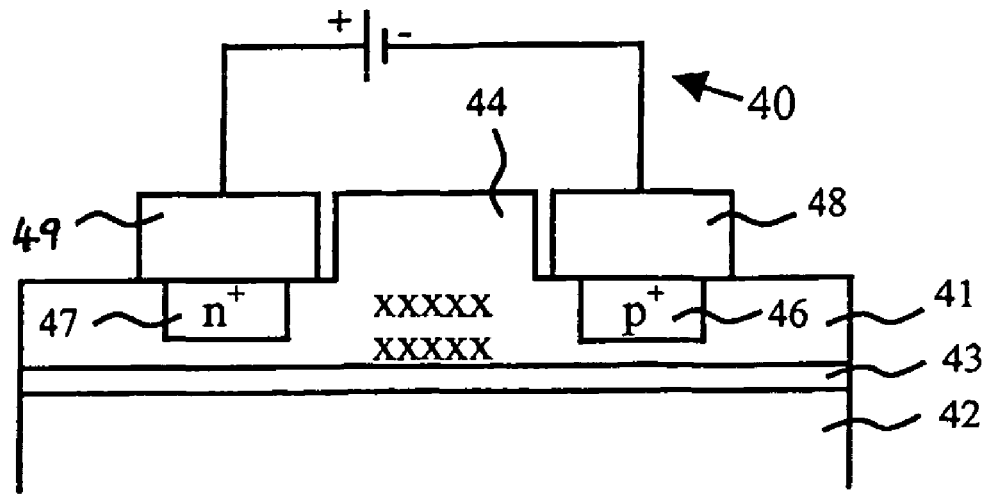

Finally, electrical contacts 48 and 49 are formed and the device connected to an electrical circuit 40 as shown in FIG. 6F.

As discussed above, when an optical signal of a selected wavelength or wavelength band, in this case the 1.3 and 1.5 micron bands commonly used in opto-communication applications, is transmitted along the rib waveguide an electrical signal is generated by charge carriers moving either to or from the deep-sub-band-gap levels either to or from the conduction valance bands as illustrated in FIG. 5 which can be detected by the electrical circuit 10 to provide an output indicative of the optical signal.

A photodiode capable of detecting photons of a wavelength greater than that corresponding to the band gap of silicon can thus be provided by forming defects in the intrinsic region of a p-i-n photodiode and engineering these defects to provide deep-sub-band-gap levels in the intrinsic region.

Other geometric arrangements of the p-i-n photodiode structure may also be used. FIGS. 2 and 4 illustrate lateral p-i-n photodiode formed across a rib waveguide. A vertical p-i-n structure may also be used, e.g. by forming p-doped regions on each side of the waveguide and an n-doped region on the top of the rib of the waveguide, or vice versa, as shown in FIG. 3. In other cases, a longitudinal p-i-n diode may also be used.

Figure 7:
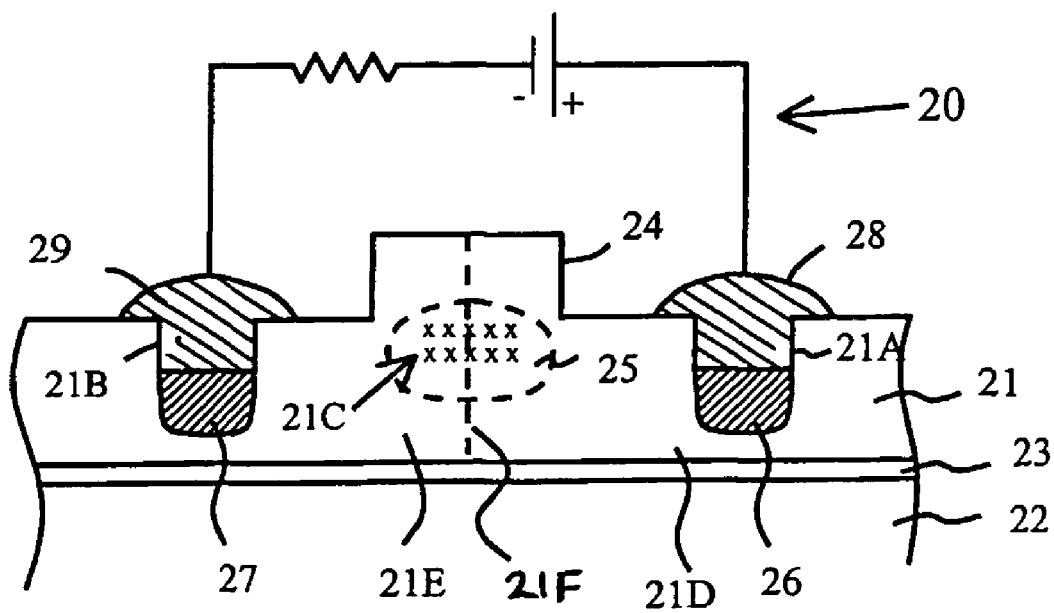
FIG. 7 shows a modified form of the device shown in FIG. 4.

FIG. 7 shows a modified form of the p-i-n photodiode shown in FIG. 4. As described above, the silicon layer 21 is nominally intrinsic. In practice, this means its level of dopant which is low enough to avoid significant optical loss. Typically such "intrinsic" material has a dopant level of around $10^{14}$ to $10^{15}$ cm$^{-3}$, optical losses usually only being of concern at levels of $10^{16}$ cm$^{-3}$ or higher. In contrast, the doped regions 26, 27 typically have a dopant level of around $10^{19}$ cm$^{-3}$.

The presence of dopant in the intrinsic material means that a pn diode is in effect formed at the interface between one of the doped regions 26, 27 and the intrinsic region. If, for instance, the intrinsic region is, in effect, lightly p-doped, a pn junction will be formed at the interface between the n-doped region 26 and the intrinsic region between the doped regions 26 and 27. Thus, when free charge carriers are created by photoabsorption in the region 21C of the deep band gap levels, they have to reach the pn junction at the interface between the n-doped region 26 and the intrinsic region before being detected. If this distance can be reduced, the response time will be improved and the likelihood of the charge carrier being absorbed before it is detected will also be reduced, i.e. the photoresponse will be increased.

In FIG. 7, the intrinsic region is modified by forming it so that one half 21D adjacent the n-doped region 26 is lightly n-doped and the other half 21E adjacent the p-doped region 27 is lightly p-doped. This gives rise to a pn diode in the centre of the device (indicated by dotted line 21F in FIG. 7) between the two lightly doped halves of the intrinsic region. This pn junction is located within the region 21C where the free charge carriers are generated so helps improve the response time of the device and reduces the likelihood that the charge carriers are absorbed before being detected.

If the intrinsic region is lightly p-doped to start with, the above arrangement can be produced by lightly doping one half of the device with n-dopant. Other ways of producing such an arrangement will be apparent to those skilled in the art. As the intrinsic region is still lightly doped, problems associated with optical loss due to absorption of the optical signal by dopant are avoided, especially if the dopant level is kept below $10^{16}$ cm$^{-3}$.

The dimensions of the rib waveguide are typically in the range of 1-20 microns. The charge carriers generated within the photodiode therefore only need to be swept over relatively short distance, e.g. 10 microns or less or preferably 5 microns or less, before being detected by the p- or n-doped regions.

The deep-sub-band gap levels may also be formed at any position or positions within the intrinsic region. For instance, instead of being centrally located as shown in FIG. 6F they may be located either side of the region, e.g. in the slab regions between the rib 44 and the doped regions 46 and 47, as indicated above.

The nature of the arrangements described above also allows the photodiode to be fabricated easily and extremely accurately and for its properties to be carefully tailored to suit the application. The energy levels of the deep band gap levels can be accurately determined as well as their location within the device. The formation of the deep band gap levels by ion implantation allows precise control of the depth and concentration of the deep band gap states so the wavelength and amount of light absorbed can be tightly controlled.

Also, whilst the invention has been described above in relation to the p-i-n photo-diode formed in silicon, the invention can also be applied to other semiconductor material in which deep band gap levels can be introduced to enable wavelengths longer than that associated with the band gap of the material to be detected. The examples given above relate to light sensors integrated on a silicon substrate but the principle is applicable to other types of substrate, e.g. in III-V compounds such as InGaAsP or InP.

When silicon is used as the semiconductor substrate the arrangements described enable the photodiode to be integrated within a silicon-based integrated optical circuit. The need to hybridise photodiodes made of other semiconductor materials onto a silicon substrate is thus avoided.

As indicated above, deep-sub-band-gap levels may be formed in various ways. One method is to form defects in the crystalline structure of silicon itself, e.g. caused by the implantation or bombardment of the silicon by hydrogen, helium or silicon atoms. Or, as mentioned above, another method is the introduction of electrical impurities such as gold, oxygen or carbon atoms.

Other absorptive materials may also be used. Examples of suitable absorptive materials include: Si/Ge alloys, Ge-rich regions within a silicon matrix, polycrystalline silicon, amorphous silicon, iron silicide, etc.

In some cases, the absorptive region may be arranged to absorb a specific wavelength or wavelength band, e.g. wavelengths of around 1.3 and/or 1.5 microns (as in the examples given above), in other cases the absorptive region may be capable of absorbing a wider range of wavelengths.

The absorptive region(s) is selected so as to be suitable for being integrally formed with or in the waveguide. This greatly facilitates the manufacture of the light sensor as it is then not necessary to hybridise the light sensor as a separate component onto the optical circuit.

In another alternative, the absorptive region may comprise a SiGe layer, e.g. formed by selective epitaxial growth on the rib of the rib waveguide. Similarly, other types of absorptive regions may be used, e.g. Ge-rich islands, Si-amorphous regions, and $FeSi_2$.

If amorphous silicon is used as the absorptive region, this may be provided at the upper portion of the rib of the rib waveguide without an intervening layer of silicon. A layer of amorphous silicon can be fabricated in the rib by ion implantation.

Amorphous silicon absorbs light at a wavelength of 1.55 microns and the dimensions of the amorphous layer, i.e. its thickness and/or length, can be adjusted to provide the required degree of absorption.

A further advantage of the in-line photodiodes described above is that they have low polarisation dependency. Even if the materials used have significant birefringence, if the waveguide has a similar confinement factor for both the TE and TM modes (the confinement factors being determined by the refractive index and geometry of the waveguide) the photodiode can be made substantially polarisation independent.

In the embodiments described above, the in-line photodiode is of the same width as the waveguide leading to and from it. However, in some cases, it may be desirable to form the photodiode portion of a different width (either wider or narrower) and provide transitional, tapered regions leading thereto.

The arrangements described above provide a number of advantages as indicated below:
(i) the light sensor region is automatically aligned with the waveguide leading thereto as it is formed within the waveguide.
(ii) There is no possibility for the light sensor region to subsequently move out of alignment with the waveguide (as can happen with a hybridised light sensor).
(iii) The light does not have to pass through interfaces or epoxy between the waveguide and the light sensor.
(iv) Fabrication is easier as the light sensor can be formed by standard lithographic techniques and a separate component does not have to be mounted and secured to the chip.
(v) The device is more rugged as it is of an integral construction.

When the arrangement is used to monitor a signal being propagated along a waveguide it also has the advantage that the proportion of light absorbed by the sensor can be accurately determined by the fabrication thereof and the fabrication techniques used are highly repeatable. This is in contrast to conventional arrangements used to tap off part of a signal, e.g. using directional couplers, Y-junctions etc. and measuring the tapped off signal. Such devices are highly sensitive to fabrication tolerances which have a significant effect upon the proportion of light that is tapped off.

FIGS. 8-13 show other arrangements which can be used to provide in-line optical sensors and/or optical sensors that are integrated with the optical circuit rather than being hybridised thereon.

Figure 8:
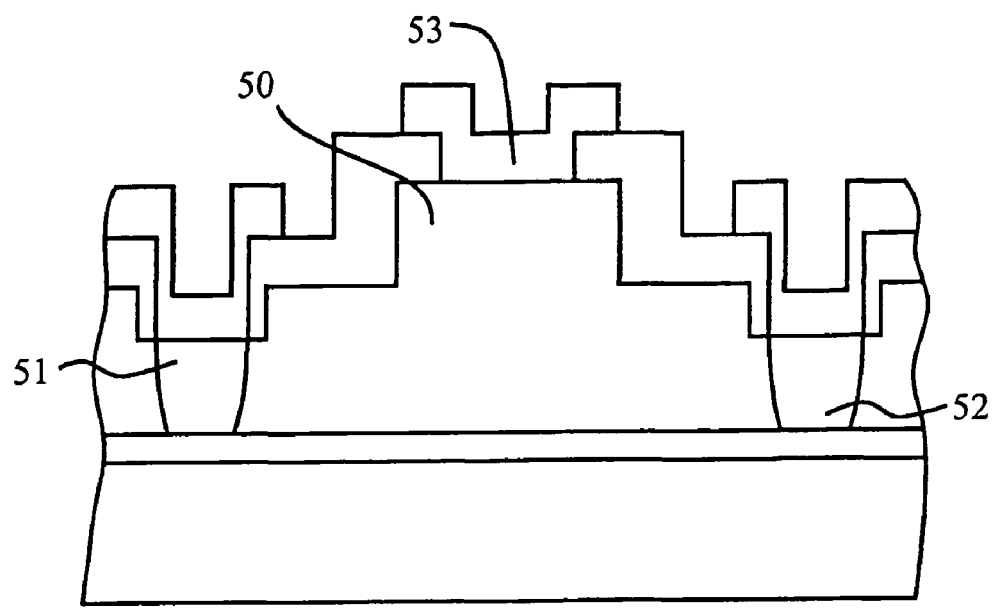
FIG. 8 is a cross-sectional view through a fourth embodiment of an in-line light sensor.
Figure 9:
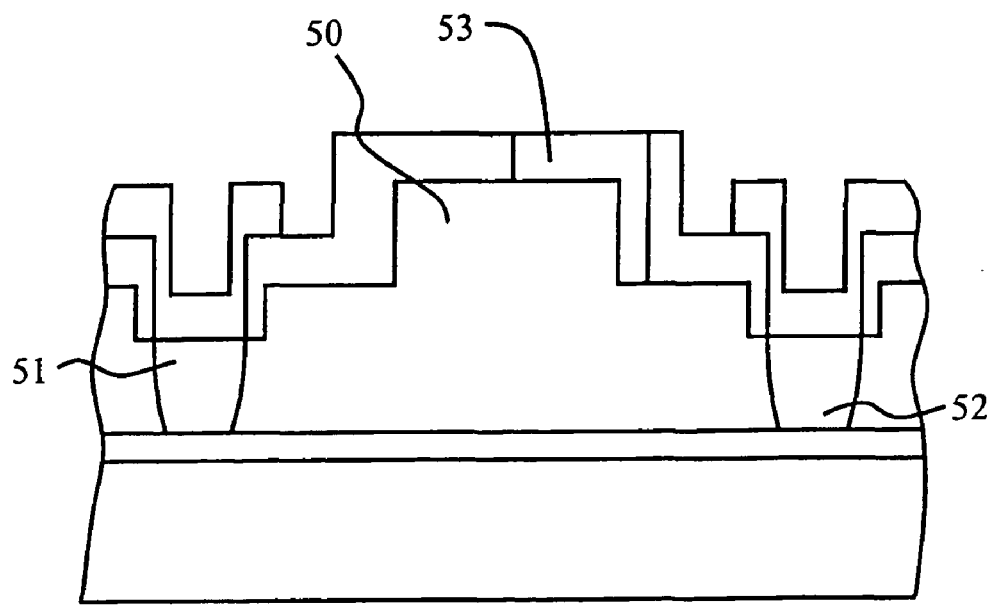
FIG. 9 is a cross-sectional view through a fifth embodiment of an in-line light sensor.

FIG. 8 shows a cross-section through a waveguide 50 which uses metallised areas to provide Schottky contacts which provide electron-hole pairs from internal photoemission. Light transmitted along the waveguide is incident upon the metallised areas (as these are provided on the walls of the waveguide) and provides charge carriers within the metal layer with sufficient energy to pass over the Schottky barrier formed between the metal layer and the semiconductor material of the waveguide so releasing charge carriers within the waveguide. As in the devices described above, these are then detected by a p-i-n diode. In the arrangement shown in FIG. 8, a vertical p-i-n diode is provided between p-doped regions 51, 52 on one or both sides of a rib waveguide 50 and the metallised layer 53 provided on the upper surface of the rib. The metallised layer 53 thus serves both to form a Schottky barrier with the semiconductor waveguide and as an electrical terminal of the p-i-n diode for detecting the charge carriers generated within the device.

The polarisation dependence of such a device can be controlled by adjusting the dimensions of the metallised area 53. In another arrangement, the metallised area may partially cover both the upper and side surface(s) of the rib waveguide 50 as shown in the embodiment illustrated in FIG. 9.

Another alternative is to interdigitate the metal contacts as shown in the plan view in FIG. 10. A first set of metallised areas 63A are provided on the upper surface of the rib 60 and a second set of metallised areas 63B are provided on both the upper and side surfaces of the rib 60 (or just on the side surface(s) thereof). The length of the metallised areas in each set can be selected to balance the TE and TM absorption by the metal contacts.

FIG. 11 is a perspective view of an in-line photodiode comprising a rib waveguide 70 made of a first material, e.g. silicon, having a portion 70A integrally formed therewith made of a second material, e.g. a silicon germanium alloy. The first material has a band gap which is too large for electrons excited by photons of the incoming light signal to move into the conduction band. However, the second material is selected to have a smaller band gap so that photons of the wavelength of light to be detected are able to move into the conductive band. The second material is chosen so as to enable said portion to be integrally formed with the remainder of the waveguide. The second material may, for instance, be formed by diffusing in another material, e.g. Ge, and then heat treating the portion to form an alloy between the first and second materials, the composition of said alloy being selected to have a lower band gap than that of the first material alone. Alternatively, a portion of the silicon waveguide can be etched away and a portion comprising a silicon-germanium alloy grown or deposited in its place. It will be apparent that the alloy should be such as to be integrally formed with the adjacent portion of the waveguide albeit with some mismatch at the boundary therebetween due to the different materials. A p-i-n diode is provided to detect the charge carriers generated in the Si/Ge portion of the waveguide. In the example shown, a longitudinal p-i-n diode is formed along the length of the waveguide, i.e. with a p-doped region 71 formed in a part of the waveguide leading to the Si/Ge portion and an n-doped region 72 formed in a part of the waveguide downstream of the Si/Ge portion. Such an in-line p-i-n diode will have low efficiency due to absorption of the optical signal by the p- and n-doped regions 71 and 72 but this may be tolerated in some applications. Indeed, in some cases, the downstream doped region 72 may be extended so as to ensure that it absorbs substantially all of the light signal received thereby, i.e. so as to form a beam dump downstream of the light sensor.

In other arrangements, particularly when it is required for at least a substantial part of the signal to pass through the device, a lateral or vertical p-i-n diode arrangement such as those described above may be used.

FIGS. 12A and 12B show an arrangement having a lateral p-i-n diode formed across a waveguide 70, p- and n-doped regions 71A and 72A being provided in the slab regions 74 on either side of the rib waveguide 70 a portion 70A of which, between the p- and n-doped regions 71A and 72A, is formed of a Si/Ge alloy.

Figure 13:
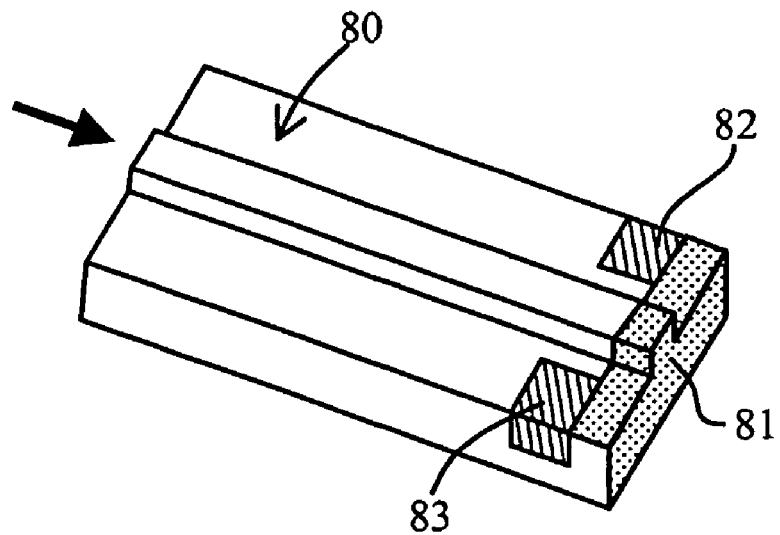
FIG. 13 is a perspective view of a light sensor according to another aspect of the invention.

FIG. 13 is a perspective view of another embodiment having a Schottky barrier for generating charge carriers within a waveguide 80. In this case, a metallised region 81 is provided on the end face of a rib waveguide (and surfaces of the waveguide adjacent the end face). Light transmitted along the waveguide 80 and incident on this metallised layer 81 gives rise to the photoemission of charge carriers into the end of the waveguide. P- and n-doped regions 82 and 83 form a lateral p-i-n diode across the waveguide to detect these charge carriers. The metal layer 81 may, for instance, be formed of platinum. A Schottky barrier is thus formed between the platinum and a layer of platinum silicide that arises at the end of the silicon waveguide 80.

FIGS. 14-22 illustrate a further extension of the arrangements described above.

Figure 14:
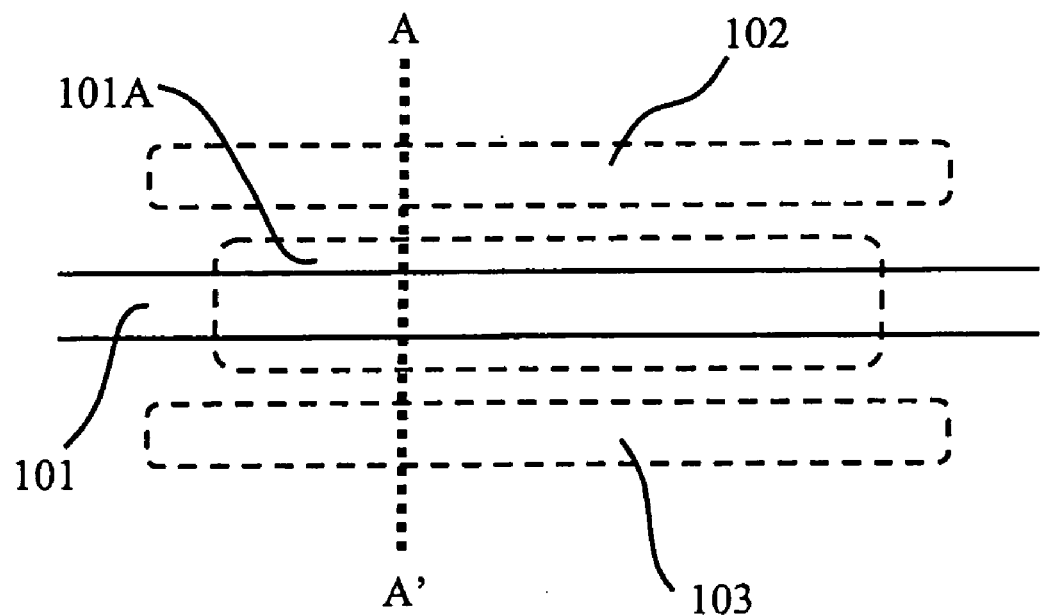
FIG. 14 is a schematic plan view of an in-line light sensor such as that shown in FIG. 2.
Figure 15:
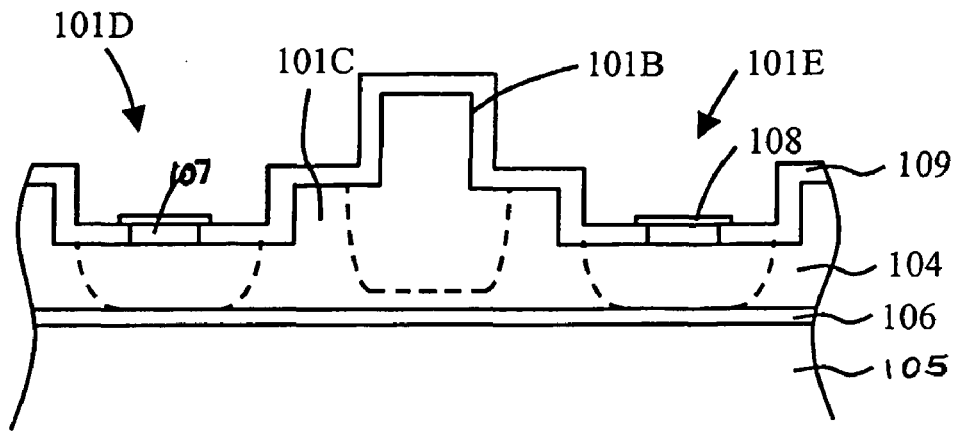
FIG. 15 is a cross-sectional view taken along line A-A' of FIG. 14.

FIG. 14 shows a plan view of the type of photodiode described above, e.g. in relation to FIGS. 1 and 2 and FIG. 15 shows a cross-section thereof (which is similar to that shown in FIG. 2).

As described above, the light sensor is formed as part of an integrated optical waveguide 101, e.g. a rib waveguide formed in silicon, preferably in a silicon-on-insulator (SOI) substrate. The photodiode is arranged to be able to detect selected wavelengths, in particular wavelengths in the range 1.5-1.6 microns as widely used in telecommunications applications. Normally, silicon is transparent at these wavelengths but a portion 101A of the waveguide 101 is modified so as to at least partially absorb wavelengths in this range leading to the generation of free charge carriers in the waveguide. There are a variety of ways of doing this as described above.

A p-i-n diode is provided to detect the presence of the charge carriers generated in this way. In the arrangement shown, p- and n-doped regions are formed on opposite sides of the waveguide 101, which is nominally intrinsic, and the p-i-n diode thus formed is used to generate an electric signal which is indicative of the power of the light signal being sensed.

FIG. 15 shows the SOI substrate comprising a silicon layer 104 separated from a supporting substrate 105 (typically also of silicon) by an optical confinement layer 106, typically of silicon dioxide (which performs an insulating function in electrical applications—hence the terminology silicon-on-insulator). The rib waveguide 101 comprises a rib 101B upstanding from a slab region 101C both of which are formed in the silicon layer 104. The p- and n-doped regions 102, 103 are formed at the base of recesses 101D, 101E formed in the silicon layer 104 and electrical contacts 107, 108 provided thereon. A passivating oxide layer 109 is provided over the silicon layer 104, except where the electrical contact is made with the doped regions 102, 103.

As indicated above, other arrangements of p-i-n diode may be used or other forms of detecting means for detecting the charge carriers generated by the absorption of light of the selected wavelength.

In the embodiment to be described, such an arrangement is modified by the provision of wavelength selective reflector means to reflect the selected wavelength or selected range of wavelengths repeatedly through the portion 101A so as to increase the absorption of the selected wavelength or selected range of wavelengths and hence the level of the signal generated, a proportion of the light being absorbed on each pass through the portion 101A.

Figure 16:
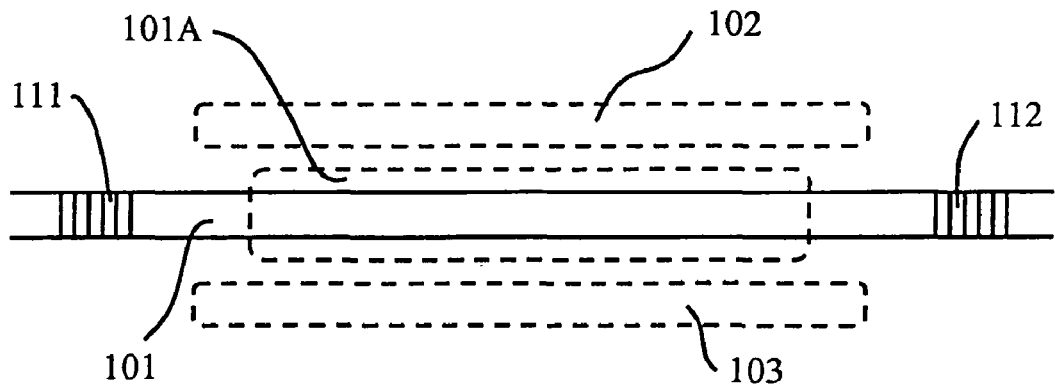
FIG. 16 shows this type of light sensor modified according to a preferred embodiment of the invention.

A preferred way of achieving this is to provide a Bragg grating in the waveguide on each side of the photodiode. This is illustrated in FIG. 16 which shows an input Bragg grating 111 at the input end of the waveguide 101 and an output Bragg grating 112 at the output end of the waveguide 101.

The gratings 111, 112 may be formed in the waveguide 101 using an electron beam lithography technique in a known manner. The periodicity of the gratings 111, 112 is designed such that they selectively reflect a single wavelength or a band of wavelengths. For example, in a waveguide carrying the wavelengths $\lambda_1, \lambda_2, \ldots, \lambda_N$, the grating may have a periodicity such that it only reflects $\lambda_2$.

Figure 17:
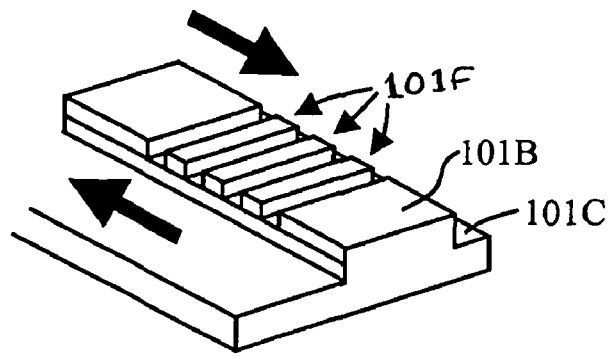
FIG. 17 is a perspective view of a Bragg grating as may be used in the arrangement shown in FIG. 16.

FIG. 17 shows a perspective view of a Bragg grating formed by etching grooves across the rib 101B of a rib waveguide.

The role of the pair of gratings 111, 112 is to tend to confine light corresponding to the grating wavelength $\lambda_n$, or wavelength range, within the region 101A of the waveguide 101 where light of that wavelength is absorbed, e.g. by the presence of gold atoms as described above. The two gratings 111, 112 together preferably form a Fabry-Perot cavity which selectively confines the wavelength $\lambda_n$ between them thus giving the detector a "resonant" condition for absorption at that wavelength. Note that because a Fabry-Perot cavity is formed then there is not a significant back-reflection of the incident light of the selected wavelength $\lambda_n$ from the input Bragg grating, i.e. input light of the selected wavelength is completely coupled into the cavity region. Light at the selected wavelength is thus forced to undergo multiple-passes of the waveguide photodetector and so, for that particular wavelength, the effective length of the photodetector is increased. The function of such a Fabry-Perot cavity is well known, e.g. as described in Chapter 9, $2^{nd}$ Edition of the textbook "Optics" by Hecht published by Addison Wesley Publishing Co.

It has been found experimentally that Bragg gratings with a line length of 3.4 μm and coupling coefficient, K, of 2.5 $cm^{-1}$ provide a good practical combination for process tolerant, high reflectivity Bragg gratings. Using these design parameters, the grating reflectivities are expected to be ~0.99 and have been shown to attenuate the selected wavelength by ~20 dB in the transmission path. This implies that in a lossless waveguide the selected wavelength would effectively undergo ~500 reflections based on the theory set out in "Optics" referred to above. The implication of this is that the effective path length for the selected wavelength in the photodetector of FIG. 16 is multiplied by a factor of ~500. This means that the wavelength-selective detector could be quite short in length yet have sufficient interaction with the selected wavelength, $\lambda_n$, to allow significant photoabsorption. A short length is desirable for the waveguide photodetector, not only so that the device is compact, but also because this minimises the unwanted absorption of the wavelengths other than the selected one, $\lambda_n$.

Figure 18:
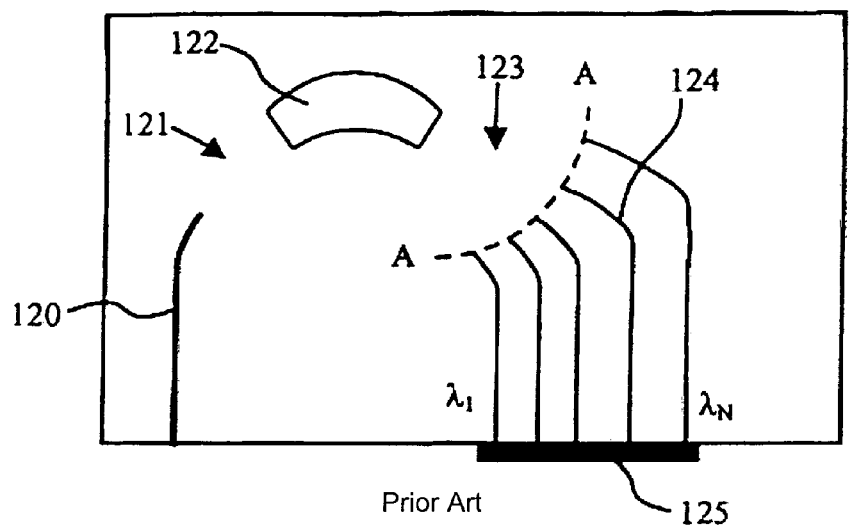
FIG. 18 is a schematic plan view of a known form of optical channel monitor.

The arrangement shown in FIG. 16 can be extended to two or more such light sensors either in series in the same waveguide or in parallel in separate waveguides. Whilst some compromise in performance will have to be accepted when used in series (to allow more than one wavelength to pass through the upstream sensor or sensors whilst maintaining sufficient wavelength selectivity within each sensor), such arrangements could be useful in certain devices. One possibility is for an arrangement performing the role of an optical channel monitor (OCM). A typical, known form of OCM is shown in FIG. 18 and comprises an input waveguide 120, a first free propagation region 121 leading to an arrayed waveguide grating (AWG) 122, the output of which crosses a second free propagation region 123 to a plurality of output waveguides 124 which lead to respective photodetectors 125.

Light enters the OCM device via the input waveguide 120. Typically, the input light will be made up of a spectrum of different wavelengths: $\lambda_1, \ldots, \lambda_N$. The input waveguide delivers the light into the AWG 122 which disperses the light into its component wavelengths. The light emerges from the AWG 122 onto a circle R. The point on R at which the light is focused is dependent upon its wavelength. Output waveguides 124 are provided along the circle R and these waveguides 124 transport the light to the edge of the optical chip. Each output waveguide 124 carries a different wavelength of light. The example shown has 5 waveguides but other arrangements may have fewer waveguides or more waveguides.

A photodiode array 125 is located at the edge of the chip where the output waveguides 124 terminate. Typically, this photodiode array 125 is made from a different material to the optical chip; for example, the optical chip may be a SIMOX silicon wafer while the photodiode array may be a III-V semiconductor. The photodiode array 125 must be carefully optically aligned to the output waveguide facets and then bonded in place by a suitable epoxy; a process known as hybridisation. Each pixel of the photodiode array 125 is used to detect the light from one of the output waveguides 124 thus providing a measure of the optical power at a particular wavelength.

Figure 19:
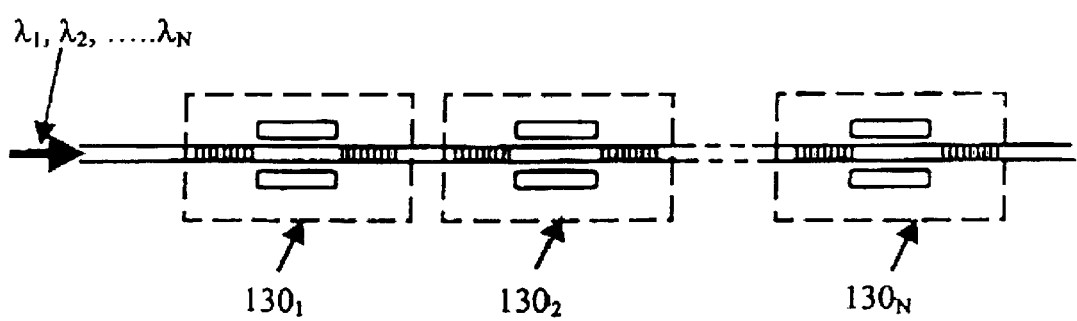
FIG. 19 is a schematic plan view of a series of light sensors according to the present invention arranged to monitor a plurality of wavelengths.

A plurality of light sensors can be used to provide a function similar to that of an OCM function. One way of doing this is to provide a sensor on each of the waveguides 124, each arranged to sense the wavelength received by the respective waveguide. Another way is to provide a plurality of light sensors in series as shown in FIG. 19. In either case, each light sensor comprising a detection region with Bragg gratings on the input and output sides thereof, each pair of Bragg gratings being arranged reflect a different wavelength or band of wavelengths.

FIG. 19 shows a series of light sensors in which light enters the series via the waveguide on the left. The light, which is composed of the wavelengths $\lambda_1, \lambda_2, \ldots, \lambda_N$, passes into a first wavelength-selective detector $130_1$ which has its Bragg grating pair set so as to preferentially photodetect one wavelength or a range of wavelengths. If the overall reflectivity of the grating is relatively low, the other wavelengths present in the optical signal will be largely unaffected by their passage through this first detector and will continue to propagate along the waveguide 101 to further waveguide photodetectors $130_2, \ldots, 130_n$. These further detectors are designed so as to selectively measure each of the remaining wavelengths or ranges of wavelengths that make up the signal so that, eventually, after a passage through N detectors (where N is the number of wavelengths in the network) every wavelength has had its power level sampled.

In order that light reflected by the detectors does not return to source, the input may be fitted with a circulator to allow the signals to continue to their destination or to be dumped or passed on for further measurement, e.g. to another circulator and another wavelength specific sensor of the type described (but tuned to another wavelength). A cascade of such circulators and wavelength specific sensors may be provided to enable a plurality of wavelengths to be monitored.

The system could be designed to optimise reflection (i.e. rejection) of wavelengths or reflectivity of the grating could be lower. In this case, ideally all of the optical power carried by the wavelength $\lambda_1$ or wavelength range would be absorbed at the first photodetector, with the other wavelengths, $\lambda_1, \lambda_2, \ldots, \lambda_N$, being reflected. However, the arrangement could be designed so as to photoabsorb only a small fraction, say 1-5%, of the total optical power in the waveguide. This is a common requirement for optical monitoring of an optical network. In fact, the conventional OCM of FIG. 18 would typically be employed in a network to monitor the spectral composition of the light output from a major network element such as an optical add-drop multiplexer (OADM) or an erbium-doped amplifier (EDFA) 140 (see FIG. 20). In such an application, the conventional OCM 141 would be preceded by a tap coupler 142 before its input that would extract typically 1-10% of the total optical power from the main network connection for monitoring purposes, while allowing the remainder to propagate onwards in the network (as illustrated in FIG. 20).

Where the reflectivity of the Bragg gratings is high (typically >0.99) then, effectively, the first Fabry-Perot cavity could monitor the combined power of a range of wavelengths, all other wavelengths being reflected. The light of the wavelength range monitored by the first sensor would be transmitted along the waveguide to the next Fabry-Perot cavity detector where a narrower range of wavelengths (or a specific wavelength) could be monitored.

Figure 20:
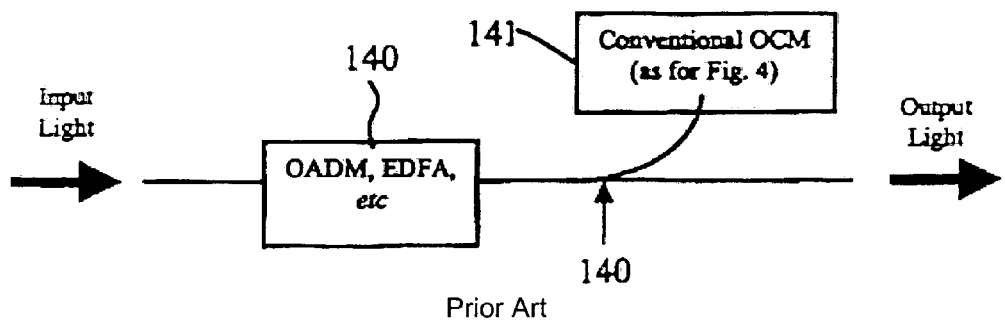
FIG. 20 is a schematic diagram illustrating a typical known arrangement of an optical channel monitor.

An advantage of the arrangement of FIG. 19 is that if the photodetectors are each designed only to absorb a small fraction of the total optical power (~1-10%) then the tap coupler 142 of FIG. 20 is no longer required. Implementing such a small tap using evanescent couplers is difficult as the tap fraction and polarisation dependent losses thereof are difficult to control.

Further advantages of the arrangement of FIG. 19 over the more conventional approach include the compact and monolithic nature of the device. In FIG. 19 the power tap, wavelength separation and photodetection functions are combined into a single monolithic chip rather than being realised as separate elements. In contrast, in the conventional approach, the tap coupler may often be implemented using a fibre coupler, the wavelength separation may be a silicon AWG, e.g. formed on a silicon-on-insulator (SOI) chip, and the photodiode array may be a semiconductor array that is hybridised onto the SOI chip using epoxy adhesive.

The AWG-based OCM shown in FIG. 18 also typically occupies a large amount of space on the optical chip; a chip that is roughly 5×7 cm would not be unusual. This is because of a number of contributing factors, including the length required for the free propagation regions 121, 123 of the AWG, the length of the AWG 122 itself and the space for the fan-out of the output waveguides 124 to the wide hybridised photodiode array 125.

In contrast, the arrangement of FIG. 19 is based upon a single waveguide and so can be made very compact. The size limitations depend mainly upon the total length of the device and the minimum bend radius of the waveguide. The device length will depend upon, among other factors, the sensitivity of the individual photodetectors and the number of wavelengths (N) in the system while the minimum bend radius will depend upon the etch-depth of the photonics.

Figure 21:
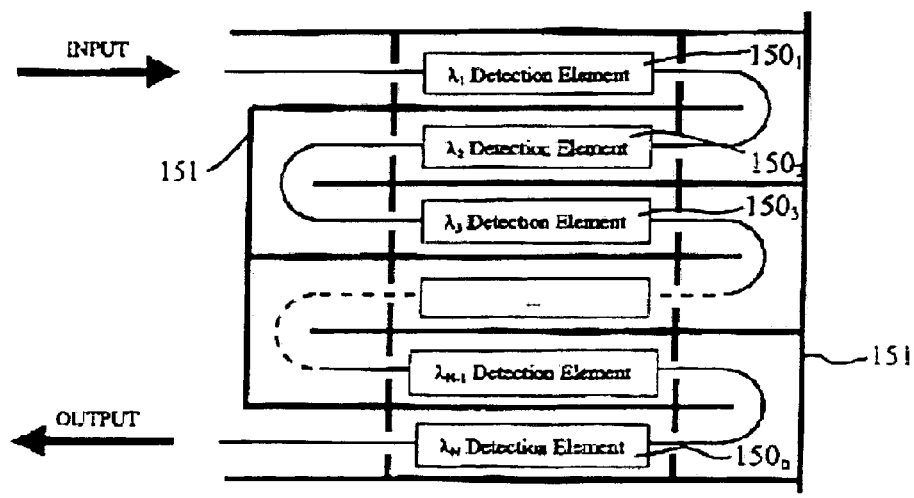
FIG. 21 is a schematic plan view of a serpentine version of the series shown in FIG. 19.

The arrangement shown in FIG. 19 could be modified to take up a compact, snake-like layout such as that shown in FIG. 21. In this layout, the detection elements $150_1, 150_2 \ldots 150_n$ may be separated from each other by isolation features 151 of the type disclosed in PCT/GB01/04191, in particular n-i-p-i-n dopant isolation and etched trenches. These measures reduce both optical and electrical crosstalk between the photodetectors.

Other similar compact layouts can also be envisaged, e.g. running the waveguide on a spiral path or minimising the size further by positioning the monitor sections on the waveguide bends. If the detection element (gratings plus diode) is 10 mm long and 250 µm wide then, allowing for bends, a 40-channel OCM would occupy ~25×10 mm, i.e. ~1/14 of the area of a conventional OCM. This opens up the possibility of integrating the OCM functionality onto the same optical chip as other photonic functions. For example, the configuration of FIG. 21 could be fabricated on a single optical chip. This would greatly simplify fabrication, create a more compact device and reduce chip-to-fibre interface losses.

As mentioned earlier, when the full spectrum of light passes into the first detector element, which is set to sample the wavelength $\lambda_1$, the other wavelengths $\lambda_2, \ldots, \lambda_N$ may also undergo a single-pass of this first detector. As a result, they also contribute to the total photocurrent of this element. This is undesirable as it represents a crosstalk component of the photocurrent. The resonant detection of $\lambda_1$ will mean that, in most circumstances, the effect of the other wavelengths is relatively small but this is not always the case. A particularly bad case would be a DWDM system comprising a large number of channels, say many tens of channels, in which the $\lambda_1$ wavelength had a low optical power while all the other channels had high powers. This problem could be dealt with by signal processing electronics. For example, if $\lambda_1$ was a low power signal but $\lambda_2$ was a high power signal (thus giving significant crosstalk at the $\lambda_1$ detector), the large $\lambda_2$ power would be picked up at the $\lambda_2$ detector. The reading on the $\lambda_2$ detector could then be used to deduce the fraction of the photocurrent from the $\lambda_1$ detector that was a result of crosstalk from $\lambda_2$. This crosstalk could then be subtracted from the signal in digital signal processing (DSP) electronics to give a true reading of the power in $\lambda_1$. Likewise, the crosstalk from the other spectral components could be removed from the data.

Another potential problem, which does not arise in a conventional OCM, is that of saturation of the detectors. Consider again the $\lambda_1$ detector's behaviour. If the number of wavelengths in the system, N, is large and most DWDM channels are operating at their maximum optical power, then the total optical power through $\lambda_1$ will be very high. This opens up the possibility that the total power may be large enough to push the $\lambda_1$ detector towards the saturation region of its operation, particularly if the $\lambda_1$ signal is also large. The detector would therefore start operating in a non-linear region of its response curve and would thus give inaccurate power measurements. This would mean that the range of powers over which the OCM could be used would be reduced, i.e. the dynamic range of the device would be decreased. To avoid this difficulty, the photodetectors can be designed with photosensitivities appropriate to the anticipated powers that would be measured and to optimise the Fabry-Perot cavity design so as to make the wavelength-selectivity of the detectors as high as possible. The photosensivity of the detectors could be adjusted by altering the levels of the dopant, e.g. gold, used to absorb the light. For example, in a network where it was known that the signal $\lambda_2$ was always going to operate over a higher range of powers than $\lambda_1$ then the level of doping in the $\lambda_2$ detector could be reduced in comparison to the $\lambda_1$ detector, thus making it less responsive to the light incident upon it.

Another possibility for dealing with detectors with different dynamic ranges would be to introduce variable optical attenuators (VOAs) into the signal path. The VOAs would typically be absorption VOAs which would essentially consist of PIN diodes placed laterally across the waveguide with a length appropriate to the required attenuation and available chip space. A VOA will attenuate the light that is input into all of the wavelength-selective detectors that follow it and so the most likely location for a VOA is at the front on the detector series, before the $\lambda_1$ detector, where it would attenuate all the input light uniformly. A second possibility would be to have VOAs positioned between each wavelength dependent detector which would give some flexibility, such that the ordering of the wavelength detectors along the waveguide length would be such that the most sensitive detectors would be placed farthest from the input. Thus, the light level would be progressively attenuated along the waveguide path as it passes into progressively more sensitive detectors. In this multiple-VOA configuration, the wavelength sensitivity of the VOAs could be exploited to enhance the wavelength selectivity of the detector. For example, PIN diode absorption VOAs that use the free carrier dispersion effect as the basis of their operation are more effective at attenuating longer wavelength signals. This means that there would be enhanced selection of shorter wavelength signals at the detectors placed at the downstream end of the series, so it would be preferable to place longer wavelength detectors closer to the input at the upstream end of the series. Of course, where the signal is expected to be propagated onwards in the network after the photodetector series (i.e. the application is a tap-monitor application rather than 100% detection) then it may be inappropriate to use VOAs.

Figure 22:
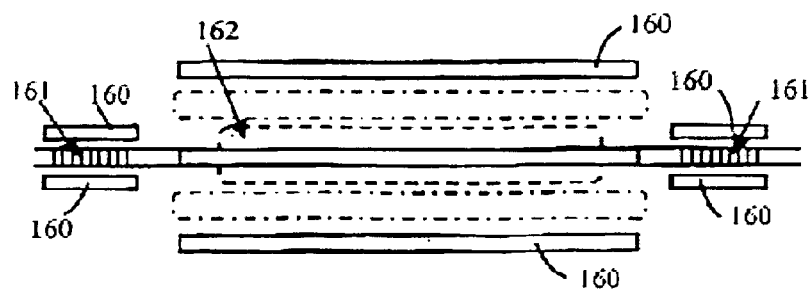
FIG. 22 is a further embodiment of the modified light sensor shown in FIG. 16.

A further extension of the above, would be to make the wavelength-selective detector or detectors dynamically tuneable. This may be done, for example, by using heater elements 160 placed adjacent to the Bragg gratings 161 and/or to the detector elements 162 as shown in FIG. 22. The heaters 160 can be used to change the temperature of the silicon rib waveguide which means that its refractive index will also be altered via the thermo-optic effect. This can be used to change the wavelength selected by the detector.

A dynamically tuneable wavelength-selective detector would enable increased functionality over the suggestions already made above. It could, for example, be used as a single tap monitor that could be set to a wavelength chosen by the network management system. Another possibility is that it could be used to dynamically scan across a continuous spectral range for power monitoring purposes. This would allow the function of an OCM (described above) to be implemented in a compact device with the advantage that the entire wavelength spectrum could be sampled. As stated previously, one of the problems of the known OCM shown in FIG. 18 is that the details of the spectral content are lost because the optical power measured by the pixels of the photodiode 125 only record the power in the respective output waveguides 124. The output waveguides 124 effectively sample the power in the particular region of the spectrum that corresponds to the channel bandwidth, rather than the detailed spectral components that make up the total power found within that spectral regional. A scanned wavelength-selective detector would instead measure a continuum of wavelengths. This is particularly desirable for monitoring the power in high bit rate systems, say 40 Gbps or greater, where OCMs suffer from intrinsic crosstalk due to the high bit rate leading to the spectral content of the signal spreading into adjacent channels.

Whilst Bragg gratings are preferred, other forms of wavelength selective reflectors may be used.

As described above, the reflector preferably reflects a single selected wavelength but in other cases it may be desirable to reflect a narrow band of selected wavelengths, to reflect a plurality of selected wavelengths or to reflect a broader band of selected wavelengths whilst rejecting wavelengths outside this band.

The p-i-n diode used to detect the charge carriers generated in the sensor may be arranged in other ways, e.g. laterally, vertically, longitudinally etc, so long as the p- and n-doped regions are positioned so that an electrical signal is generated across the diode in response to the generation of free charge carriers in the sensor. Other forms of detector means may also be used to detect the presence of the free charge carriers.

As described above, a portion of the light path preferably absorbs light of a selected wavelength to generate free charge carriers. This can be achieved in a variety of ways including the provision of one or more of the following in said portion: amorphous material, polycrystalline material, an alloy, a material which has been doped and/or had defects formed therein to provide deep band gap states within the band gap thereof and a material having isolated regions, e.g. quantum dots, therein which generate charge carriers when illuminated by the selected wavelength. Alternatively, said portion of the path is provided with one or more metallised areas which form a Schottkey barrier with the material of said portion.

The p-i-n photodiode structure described herein may also be used in relation to other types of waveguide or in any arrangement in which light transmitted along a waveguide is to be monitored or sensed, e.g. at the end of a waveguide or within a resonant cavity.

The invention claimed is:

1. An optical device, comprising:
a light-transmitting medium defining a waveguide having a sensing portion and a non-sensing portion of the waveguide, the portion of the light transmitting medium that defines the non-sensing portion of the waveguide being continuous with the portion of the light-transmitting medium that defines the non-sensing portion of the waveguide,
the light-transmitting medium that defines the sensing portion of the waveguide having defects that provide the light-absorptive region with a deep band gap level between a valence band of the light-transmitting medium and a conduction band of the light-transmitting medium,
the deep band gap level configured such that the waveguide guiding light signals through the light-transmitting medium in the sensing portion causes free carriers to be generated in the light-transmitting medium,
the light transmitting medium that defines the non-sensing portion of the waveguide excluding the defects, and
the light-transmitting medium and/or the dimensions of the light-transmitting medium are selected so as to provide similar confinement factors for both the TE and TM modes of the light signals such that the detection of light thereby is substantially polarization independent.

2. The device of claim 1, further comprising:
electronics configured to detect a presence of a photocurrent resulting from a presence of the free carriers in the sensing portion of the waveguide.

3. The device of claim 1, wherein the light-transmitting medium has a crystal structure and the defects are defects in the crystal structure.

4. The device of claim 1, wherein the defects in the light-transmitting medium are impurities in the light-transmitting medium.

5. The device of claim 4, wherein a structure of the light-transmitting medium is a crystal lattice and the impurities replace molecules of the light-transmitting medium in the crystal lattice.

6. The device of claim 1, wherein a pn diode is formed within a portion of the waveguide where the light-transmitting medium includes the defects.

7. The device of claim 1, wherein a p-i-n diode is formed within a portion of the waveguide where the light-transmitting medium includes the defects.

8. The device of claim 7, wherein the p-i-n diode includes a p-doped region of the light-transmitting medium spaced apart from an n-doped region of the light transmitting medium.

9. The device of claim 8, further comprising: electronics configured to provide a reverse bias between the p-doped region and the n-doped region.

10. The device of claim 1, wherein the waveguide is defined by a ridge extending upward from a slab,
recesses extend into the slab on opposing sides of the ridge,
the p-doped region and the n-doped region each extending into the light-transmitting medium from a bottom of one of the recesses.

11. The device of claim 10, wherein the recesses are each spaced apart from the ridge.

12. The device of claim 1, wherein the defects are positioned in the light transmitting medium such that the defects interact with only a portion of a mode of the light signals as the light signals travel through the sensing portion.

13. The device of claim 1, wherein the light-transmitting medium consists of silicon.

14. The device of claim 1, wherein the defects are in accordance with ions implanted in the light-transmitting medium.

15. The device of claim 1, further comprising:
a wavelength selective reflector that receives the light signals and reflects the light signals having selected wavelengths such that the light signals having selected wavelengths travel through the sensing portion more than once.

16. The device of claim 15, wherein the wavelength selective reflector includes a Bragg grating.

17. The device of claim 1, wherein the light-absorptive region of the light-transmitting medium is in accordance with a region of the light-transmitting medium formed by deposition of ions into the light-transmitting medium.

18. The device of claim 1, wherein the defects include vacancy pairs in a lattice structure of the light-transmitting pair.

19. The device of claim 1, wherein the defects are ion implantation induced defects.

20. The device of claim 1, wherein
the light-transmitting medium has a crystal structure and the defects are defects in the crystal structure;
a pn diode is formed within a portion of the waveguide where the light-transmitting medium includes the defects;
the waveguide is defined by a ridge extending upward from a slab, recesses extend into the slab on opposing sides of the ridge, the p-doped region and the n-doped region each extending into the light-transmitting medium from a bottom of one of the recesses;
further comprising: electronics configured to detect a presence of a photocurrent resulting from a presence of the free carriers in the sensing portion of the waveguide; and
further comprising a wavelength selective reflector that receives the light signals and reflects the light signals having selected wavelengths such that the light signals having selected wavelengths travel through the sensing portion more than once.

* * * * *